(12) United States Patent
Inoue et al.

(10) Patent No.: US 12,738,709 B2
(45) Date of Patent: Sep. 15, 2026

(54) SEMICONDUCTOR LASER DEVICE

(71) Applicant: Ushio Denki Kabushiki Kaisha, Tokyo (JP)

(72) Inventors: Yutaka Inoue, Tokyo (JP); Shigeta Sakai, Tokyo (JP); Masato Hagimoto, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 667 days.

(21) Appl. No.: 18/136,248

(22) Filed: Apr. 18, 2023

(65) Prior Publication Data

US 2023/0387653 A1 Nov. 30, 2023

(30) Foreign Application Priority Data

May 31, 2022 (JP) ................................ 2022-088923

(51) Int. Cl.
*H01S 5/0234* (2021.01)
*H01S 5/10* (2021.01)
*H01S 5/40* (2006.01)

(52) U.S. Cl.
CPC .......... *H01S 5/0234* (2021.01); *H01S 5/1082* (2013.01); *H01S 5/4031* (2013.01)

(58) Field of Classification Search
CPC .... H01S 5/0234; H01S 5/1082; H01S 5/4031; H01S 5/4025; H01S 5/0202; H01S 5/0216; H01S 5/0237; H01S 5/22; H01S 5/2202
See application file for complete search history.

(56) References Cited

U.S. PATENT DOCUMENTS 6,757,311 B2 * 6/2004 Abe .................... H01S 5/06216 372/43.01
2005/0069006 A1 * 3/2005 Tatsumi .............. H01S 5/04254 372/50.1

(Continued)

FOREIGN PATENT DOCUMENTS

JP 2008-252069 A 10/2008
JP 2010-245207 A 10/2010

(Continued)

OTHER PUBLICATIONS

Japanese Office Action mailed on Nov. 18, 2025 for Japanese Patent Application No. 2022-088923, from which the current U.S. Appl. No. 18/136,248 claims priority.

*Primary Examiner* — Xinning(Tom) Niu
(74) *Attorney, Agent, or Firm* — Yoshida & Associates LLC; Kenichiro Yoshida

(57) ABSTRACT

A semiconductor laser device includes a submount and an edge-emitting semiconductor laser chip mounted to the submount by a junction-down method. The semiconductor laser chip includes a semiconductor substrate, a stacked growth layer in which m (m≥1) laser resonators are formed, m P electrodes, and an N electrode. When a beam emission direction is denoted as a z-axis, a direction of the thickness of the semiconductor substrate as a y-axis, and a direction orthogonal to the z-axis and the y-axis as an x-axis, the m laser resonators are located in an area of the stacked growth layer except directly under a center of the second face of the semiconductor substrate in the x-axis direction. More preferably, the m laser resonators are located on the side opposite to the center of the second face of the semiconductor substrate when viewed from the center of the first face thereof.

11 Claims, 13 Drawing Sheets

(56) References Cited

U.S. PATENT DOCUMENTS

2008/0219309 A1 9/2008 Hata et al.
2009/0147816 A1* 6/2009 Iga ........................... H01S 5/22 372/50.12
2009/0311815 A1* 12/2009 Miyachi ................ H01S 5/4043 438/31
2010/0254421 A1 10/2010 Iga et al.
2011/0051773 A1* 3/2011 Tanikawa ............. H01S 5/4031 372/50.12
2011/0235497 A1 9/2011 Ogata et al.
2017/0077674 A1* 3/2017 Hagimoto ............ H01S 5/3202
2025/0112439 A1 4/2025 Murakawa et al.

FOREIGN PATENT DOCUMENTS

JP 2011-227980 A 11/2011
JP 2012-222205 A 11/2012
JP 2017-059620 A 3/2017
JP 2022-011292 A 1/2022
WO 2023/145763 A1 8/2023

* cited by examiner 200A
100A
210
220
Sp2
110
S1
140
106
154
218
216
214
212
104
102
152
S2
Sp1
122
130
124
126
120
150
xn
xp
xc
x
y
z 200Aa
100Aa
110
140
154
218
216
214
212
210
220
220
152
102
104
122
130
124
126
120
150
xn
xp
xc
x
y
z 200Ab
100Ab
Sp2
110
140
154
218
216
214
212
210
220
220
152
Sp1
102
104
122
130
124
126
120
150
xn
xp
xd
xc
x
y
z 200Ad
100Ad
110
S1
140
154
218
216
214
212
210
220
220
xp
xn
xc
104
102
152
S2
122
130
124
126
120
150
x
y
z 200Ae
100Ae
10
110
S1
140
154
218
216
214
212
210
152
S2
102
104
122
130
124
126
120
150
xz
xp
xn
xc
x
y
z 200Af
100Af
110
140
220
210
154
218
216
214
212
104
102
152
122
130
124
126
120
150
xp
xn
xc
x
y
z 200Ag
100Ag
110
140
154
218
216
214
212
210
220
220
152
102
104
122
130
124
126
120
150
xn
xp
xc
x
y
z 200Ba
100Ba
110
140
220
220
210
152
102_1
102_2
150_1
150_2
Δx1
Δx2
x1
xc
x2
xp
xn
122
130
124
126
120
x
y
z 200D
100D
220
210
Sp2
110
S1
140
106
154
xn
218
xp
216
152
104
102
214
xc
212
S2
Sp1
122
130
124
126
120
150
x
y
z

SEMICONDUCTOR LASER DEVICE

CROSS-REFERENCE TO RELATED APPLICATION(S)

This application claims priority from Japanese Patent Application No. 2022-088923 filed on May 31, 2022. The entire teachings of the above application are incorporated herein by reference.

BACKGROUND ART

The present disclosure relates to a semiconductor laser device.

Semiconductor lasers with ridge-stripe laser resonators have been widely used as high-power edge-emitting lasers.

Japanese Unexamined Patent Application Publications No. 2017-059620 and No. 2010-245207 disclose a technique in which a semiconductor laser chip is mounted to a submount by a junction-down method. Japanese Unexamined Patent Application Publication No. 2017-059620 discloses a technique in which the light-emitting section is disposed closer to directly under the die bonding load in order to achieve a good bonding between the semiconductor laser chip and the submount in a semiconductor laser device that uses a narrow-width tilted substrate. Japanese Unexamined Patent Application Publication No. 2010-245207 discloses a technique in which the light-emitting section is mounted in the center of the semiconductor laser chip.

SUMMARY OF THE INVENTION

As a result of studying the semiconductor laser devices described in Japanese Unexamined Patent Application Publication No. 2017-059620 and No. 2010-245207, the present inventors have come to recognize the following issues. In Japanese Unexamined Patent Application Publication No. 2017-059620 and No. 2010-245207, the load of die bonding by a junction-down method is applied to the light-emitting section, i.e., the laser resonator, and this may cause a decrease in reliability. Note that this problem should not be understood as a general recognition of those skilled in the art; however, it is one that the present inventors have recognized on their own.

An aspect of the present disclosure is made under such circumstances, and one of the exemplary purposes is to provide a semiconductor laser device with improved reliability.

An aspect of the present disclosure relates to a semiconductor laser device. The semiconductor laser device includes a submount and an edge-emitting semiconductor laser chip mounted to the submount by a junction-down method. The semiconductor laser chip includes a semiconductor substrate, a stacked growth layer in which m ($m \geq 1$) laser resonators are formed, m P electrodes connected to the m laser resonators, and an N electrode formed on a second face of the semiconductor substrate. The stacked growth layer includes a first conductive cladding layer, a light-emitting layer, and a second conductive cladding layer, and is formed on a first face of the semiconductor substrate. When a beam emission direction is denoted as a z-axis, a direction of the thickness of the semiconductor substrate as a y-axis, and a direction orthogonal to the z-axis and the y-axis as an x-axis, the m laser resonators are located in an area of the stacked growth layer except directly under the second face of the semiconductor substrate in the x-axis direction. More preferably, they are located on the side opposite to the center of the second face of the semiconductor substrate when viewed from the center of the first face of the semiconductor substrate.

Any combination of the above components, and substitution of components or expressions among methods, devices, systems, etc., are also valid as an aspect of the present invention or the present disclosure. Furthermore, the description of this "SUMMARY OF THE INVENTION" does not describe all the indispensable features of the present invention, and hence sub combinations of these features described can also be the present invention.

An aspect of the present disclosure is capable of improving the reliability of semiconductor laser devices.

DETAILED DESCRIPTION OF THE EMBODIMENTS

Overview of the Embodiments

Figure 1:
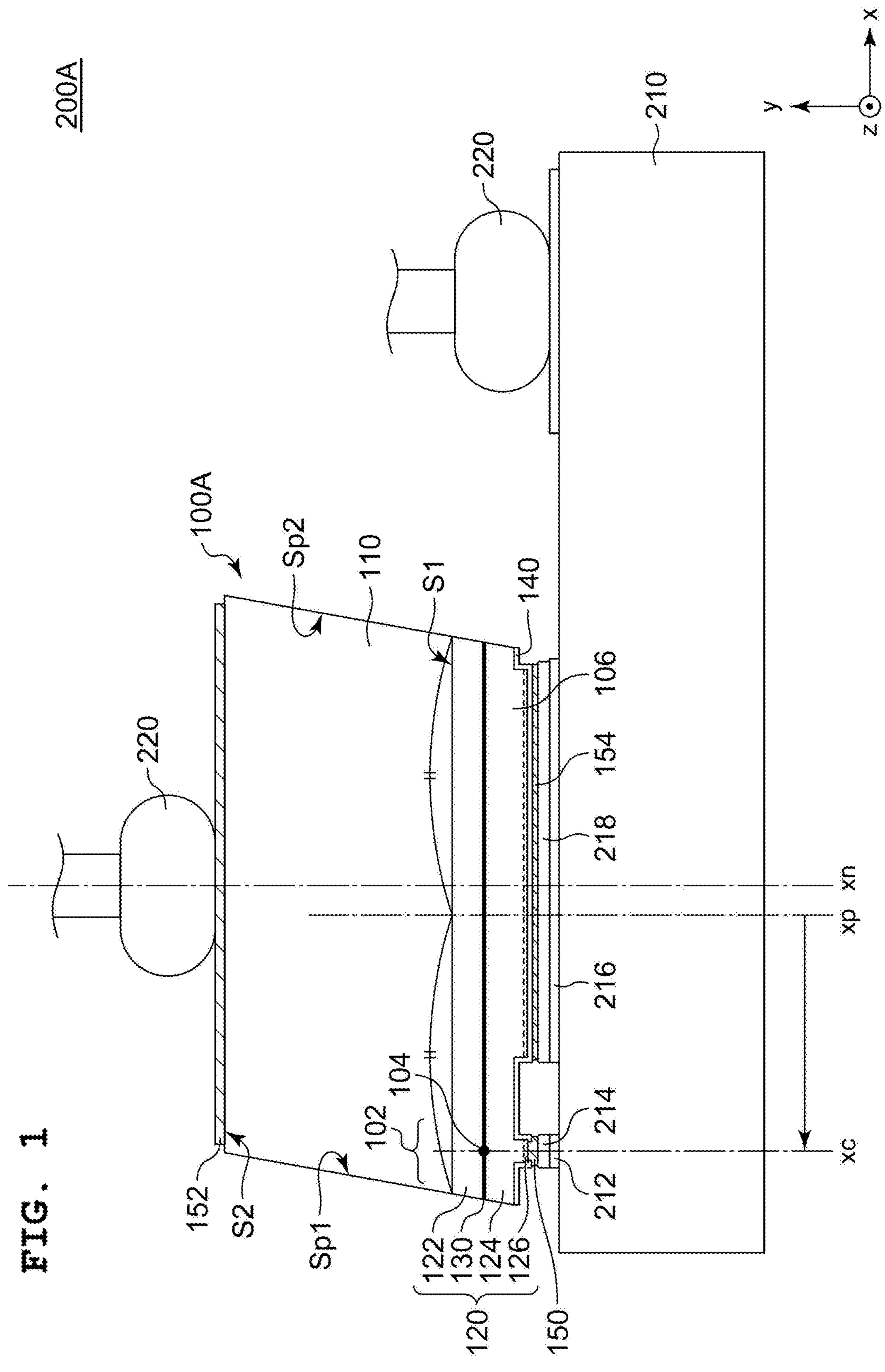
FIG. 1 is a cross-sectional view of a semiconductor laser device according to Example 1.

Hereinafter, an overview of some exemplary embodiments of the present disclosure will be described. This overview is intended as a preface to the detailed description that follows, or for a basic understanding of the embodiments. The overview describes some concepts of one or more embodiments in a simplified manner and is not intended to limit the scope of the invention or disclosure. In addition, the overview is not a comprehensive overview of all conceivable embodiments, nor does it limit the indispensable components of embodiments. For convenience, "one embodiment" may be used to refer to one embodiment (Example or Variation Example) or a plurality of embodiments (Examples or Variation Examples) disclosed in the present specification.

The semiconductor laser device according to one embodiment includes a submount and an edge-emitting semiconductor laser chip mounted to the submount by a junction-down method. The semiconductor laser chip includes a semiconductor substrate, a stacked growth layer in which m (m≥1) laser resonators are formed, m P electrodes connected to the m laser resonators, and an N electrode formed on a second face of the semiconductor substrate. The stacked growth layer includes a first conductive cladding layer, a light-emitting layer, and a second conductive cladding layer, and is formed on a first face of the semiconductor substrate. When a beam emission direction is denoted as a z-axis, a direction of the thickness of the semiconductor substrate as a y-axis, and a direction orthogonal to the z-axis and the y-axis as an x-axis, the m laser resonators are located in an area of the stacked growth layer except directly under a center of the second face of the semiconductor substrate in the x-axis direction. More preferably, the m laser resonators are located on the side opposite to the center of the second face of the semiconductor substrate when viewed from the center of the first face of the semiconductor substrate.

When a semiconductor laser chip is bonded (die bonding) to a submount, a load is applied to the back surface of the semiconductor laser chip, or the center of the second face of the semiconductor substrate in a junction-down method, by a collet or the like. In the above configuration, the m laser resonators are disposed to be shifted from the center of the first face of the semiconductor substrate in a direction away from the load position corresponding to the center of the second face. This prevents a large load from being applied directly to the laser resonators, thereby improving reliability.

The position of the laser resonator in the x direction refers to the center position of the current constriction structure such as a ridge structure. For m≥2, the position of the m laser resonators refers to the center of the positions of the laser resonators at both ends.

In one embodiment, the semiconductor substrate may be a tilted substrate having a first pelletized face having an acute angle with the first face and a second pelletized face having an obtuse angle with the first face. Note that a pelletized face is a face that is cut when a semiconductor chip is cut into pieces from a wafer or the like. The m laser resonators may be located on a side of the first pelletized face in the x-axis direction with respect to a center of the first face.

In one embodiment, of the m laser resonators, the laser resonator closest to the first pelletized face may be located closer to the first pelletized face than an edge of the N electrode on the side of the first pelletized face.

In one embodiment, a side face of the semiconductor laser chip may be substantially perpendicular to the submount in a first portion near the submount and tilted in a second portion far from the submount. This structure will be described in detail later in FIG. 5 and other figures. This structure appears by forming a pelletized groove at a position corresponding to the pelletized line of the semiconductor laser chip in the wafer before being pelletized. The performance of pelletizing after forming the pelletized groove enables the wafer to be broken along the pelletized groove even if the actual pelletized line is shifted, preventing the laser resonator from being affected in the case where the laser resonator is located close to the side face of the semiconductor laser chip.

In one embodiment, the side face of the semiconductor laser chip may be covered with an insulation layer in the first portion. The insulation layer protects a PN junction portion, thereby preventing short circuit caused by solder or foreign matter or the like in the case where the laser resonator is located close to the side face of the semiconductor laser chip.

In one embodiment, the insulation layer on the side face of the semiconductor laser chip may be covered with a metal layer. This enables the dissipation of the heat of the laser resonator using the metal layer on the side face of the semiconductor laser chip.

In one embodiment, the semiconductor laser chip may further include a wide electrode adjacent to the m P electrodes and formed in an area including the center of the second face of the semiconductor substrate. This enables a strong load to be applied to the wide electrode, achieving a strong bonding between the semiconductor laser chip and the submount.

In one embodiment, it is m≥2 and each laser resonator may have a different width of the P electrode. Controlling the width of the P electrode reduces variations in heat dissipation properties among multiple laser resonators and variations in stress among multiple laser resonators.

A semiconductor laser device according to one embodiment includes a submount and an edge-emitting semiconductor laser chip mounted to the submount by a junction-down method. The semiconductor laser chip includes a semiconductor substrate, a stacked growth layer in which m (m≥1) laser resonators are formed, the m P electrodes connected to the m laser resonators, and an N electrode formed on the second face of the semiconductor substrate. The stacked growth layer includes a first conductive cladding layer, a light-emitting layer, and a second conductive cladding layer, and is formed on the first face of the semiconductor substrate. When the beam emission direction is denoted as the z-axis, a direction of the thickness of the semiconductor substrate as the y-axis, and a direction orthogonal to the z-axis and the y-axis as the x-axis, the m laser resonators are located in a side opposite to a side where a center of the N electrode is located with respect to the center of the first face of the semiconductor substrate in the x-axis direction.

The suction position of the collet in die bonding may exist near the center of the N electrode on the second face of the semiconductor substrate. In the above configuration, the m laser resonators are disposed to be shifted from the center of the first face of the semiconductor substrate in a direction away from the load position that exists near the center of the N electrode. This prevents a large load from being applied directly to the laser resonators, thereby improving reliability.

A semiconductor laser device according to one embodiment includes a submount and an edge-emitting semiconductor laser chip mounted to the submount by a junction-down method. The semiconductor laser chip includes a semiconductor substrate, a stacked growth layer in which m (m≥1) laser resonators are formed, the m P electrodes connected to the m laser resonators, and an N electrode formed on the second face of the semiconductor substrate. The stacked growth layer includes a first conductive cladding layer, a light-emitting layer, and a second conductive cladding layer, and is formed on the first face of the semiconductor substrate. When the beam emission direction is denoted as the z-axis, the thickness direction of the semiconductor substrate as the y-axis, and the direction orthogonal to the z-axis and the y-axis as the x-axis, the m laser resonators are located in a side opposite to a side where a center of a bonding wire connected to the N electrode is located with respect to the center of the first face of the semiconductor substrate in the x-axis direction.

In many cases of die bonding, the suction position of the collet coincides with the center position of the bonding wire. In such cases, the load position during die bonding exists in the vicinity of the center of the bonding wire. In the above configuration, the m laser resonators are disposed to be shifted in a direction away from the load position that exists near the center of the bonding wire with respect to the center of the first face of the semiconductor substrate. This configuration prevents a large load from being applied directly to the laser resonators, thereby improving reliability.

EMBODIMENT

Hereinafter, the present disclosure will be described with reference to the drawings based on suitable embodiments. Identical or equivalent components, members, and processes shown in the respective drawings are marked with the same symbols, and duplicated descriptions are omitted as appropriate. The embodiments are intended to be exemplary rather than to limit the disclosure, and all features and combinations thereof described in the embodiments are not necessarily essential to the disclosure.

The dimensions (thickness, length, width, etc.) of each member described in the drawings may be scaled as appropriate for ease of understanding. Furthermore, the dimensions of a plurality of members do not necessarily represent their relationship in size; although one member A is drawn thicker than another member B on the drawing, the member A may be thinner than the member B, for example.

Example 1

FIG. 1 is a cross-sectional view of a semiconductor laser device 200A according to Example 1. The semiconductor laser device 200A includes an edge-emitting semiconductor laser chip 100A and a submount 210. FIG. 1 illustrates a view from the emitting edge, and the beam is assumed to emit in the direction perpendicular to the front of the paper. For the convenience of description, the coordinate axes are defined as follows: the z-axis is the beam emission direction (depth direction on the paper), the y-axis is the thickness direction of the semiconductor substrate 110 (up-and-down direction on the paper), and the x-axis is the direction orthogonal to the z and y axes (left-right direction on the paper).

The semiconductor laser chip 100A is mounted to the submount 210 by a junction-down method.

The semiconductor laser chip 100A has a layered structure including a semiconductor substrate 110, a stacked growth layer 120, a P electrode 150, and an N electrode 152. The semiconductor substrate 110 can be an N-type GaAs substrate for a red laser and an N-type GaN substrate for a blue or green laser. The semiconductor substrate 110 has a first face S1, a second face S2, a first pelletized face Sp1, and a second pelletized face Sp2. The stacked growth layer 120 is formed on the first face S1 of the semiconductor substrate 110. The stacked growth layer 120 includes an N-type cladding layer 122, a light-emitting layer 130, a P-type cladding layer 124, and a P-type contact layer 126. The light-emitting layer 130 may include an N-type guide layer, an active layer (quantum well layer), and a P-type guide layer. An insulation layer 140 is formed on the stacked growth layer 120.

A waveguide structure is formed in the stacked growth layer 120 to confine light, and cleaved surfaces at both ends of the waveguide structure serve as mirrors to form a laser resonator 102. The resonator 102 has an emission end face that serves as an emitter 104, from which the beam is emitted in the z-direction (toward the front direction on the paper). The cleaved surface may be formed with a reflective layer with adjusted reflectivity.

The semiconductor laser chip 100A is formed with the m ($m \geq 1$) laser resonators 102. In the present embodiment, it is $m=1$. As explained in Example 3, when $m \geq 2$, the m laser resonators 102 are arranged adjacent to each other in the x-axis direction.

The waveguide structure can be, for example, a ridge structure. The ridge structure is formed by partially removing the P-type cladding layer 124. The ridge structure is also simply referred to as a ridge or a ridge stripe structure. A bank 106 is formed in the area adjacent to the laser resonator 102. The waveguide structure can be an embedded ridge waveguide.

Alternatively, the waveguide structure may be a channeled substrate planar (CSP) structure in which grooves are formed along the waveguide in the semiconductor substrate 110 and the thickness of the N-type cladding layer 122 is relatively thick at the portion of the grooves.

Although the ridge structure and the CSP structure are waveguide structures using refractive index distribution, the present disclosure is not limited thereto; the present disclosure may adopt gain waveguide structures using gain distribution. These structures can be understood as current constriction structures as well as optical confinement structures.

The N electrode 152 is formed on the second face S2 of the semiconductor substrate 110. One end of a bonding wire 220 is connected to the N electrode 152. The other end of the bonding wire 220 is connected to a wiring pattern on the submount 210.

The P electrode 150 is formed on the stacked growth layer 120 (the down side of the paper in FIG. 1) and at a position corresponding to each of the m laser resonators 102. Specifically, an opening is formed in the insulation layer 140 at the portion corresponding to each of the laser resonators 102, and the P electrode 150 is formed to be in contact with the P-type contact layer 126. The P electrode 150 is referred to as a driving electrode because it is used to drive the laser resonators 102.

A wide electrode (also referred to as a bank electrode) 154 is formed on an area corresponding to the bank 106 and adjacent to the P electrode 150. This wide electrode 154 is also referred to as a bonding electrode because it is primarily intended for bonding to the submount 210. In the example shown in FIG. 1, the P electrode 150 is electrically insulated with the wide electrode 154. The N electrode 152 is referred to as an upper electrode. The P electrode 150 and the wide electrode 154 are collectively referred to as a bottom electrode.

The semiconductor laser chip 100A is mounted to the submount 210 by a junction-down method. The submount 210 can be made of a substrate with excellent heat dissipation properties; for example, a ceramic substrate such as aluminum nitride (AlN) is suitable. The junction-down method involves mounting by which the stacked growth layer 120 of the semiconductor laser chip 100A is mounted to face the submount 210. Specifically, the P electrode 150 is electrically connected to a wiring pattern 212 on the submount 210 via solder 214, and is mechanically bonded thereto. In addition, the wide electrode 154 is mechanically bonded to a wiring pattern 216 via solder 218.

The junction-down method has the advantage of high cooling efficiency because the laser resonator 102, which is a heat-generating part, is located closer to the submount 210.

The following describes a position xc of the laser resonator 102 in the x-axis direction. When $m=1$, the position xc is the center position of the emitter 104, in other words, the center of the current constriction structure (ridge structure).

The center of the first face S1 of the semiconductor substrate 110 is denoted as a position xp and is referred to as a reference position. The center of the second face S2 of the semiconductor substrate 110 is denoted as a position xn. When the semiconductor laser chip 100A is bonded to the submount 210, the center position xn of the second face S2 is suctioned with a collet or the like, and is subject to load in a manner that it is pressed against the submount 210 to which solder has been applied. In other words, the center position xn of the second face S2 can be regarded as a load position during die bonding. The actual load position may be deviated from the center position xn.

In the present embodiment, the laser resonator 102 is located on the opposite side of the load position xn, which is the center position of the second face S2, with respect to the reference position xp. In other words, the laser resonator 102 is located on the opposite side of the center of the second face of the semiconductor substrate with respect to the center of the first face of the semiconductor. In other words, the laser resonator 102 is located at the position xc that is a position away from the load position xn. This reduces the load applied to the laser resonator 102 during die bonding, thereby reducing mechanical and optical effects.

In FIG. 1, the semiconductor substrate 110 has the tilted pelletized faces Sp1 and Sp2. This is referred to as a tilted substrate or an inclined substrate. The first pelletized face Sp1 of the semiconductor substrate 110 has an acute angle) (<90° formed with the first face S1, and the second pelletized face Sp2 of the semiconductor substrate 110 has an obtuse angle) (>90° formed with the first face S1. The position xc of the laser resonator 102 is closer to the first pelletized face Sp1 than the reference position xp.

The configuration of the semiconductor laser device 200A has been described above.

The load at die bonding is the largest at the position xn. When the laser resonator 102 is located at the reference position xp, which is the center of the first face S1 of the semiconductor substrate 110, the laser resonator 102 is subject to a large load. This load may influence an undesirable mechanical effect on the laser resonator 102 and reduce its reliability. The structure of FIG. 1 allows the laser resonator 102 to be located far from the load position xn, thus preventing a large load from being directly applied to the laser resonator 102 during die bonding, thereby improving reliability.

The structure of FIG. 1 can reduce residual stress in the laser resonator 102. The residual stress also influences optical effects on the laser resonator 102. Specifically, the residual stress can cause refractive index variations in the waveguide, resulting in unintended wavelength shifts and misalignment in the waveguide direction. The structure in FIG. 1 enables the reduction of the residual stress, thereby stabilizing optical performance.

In addition, the presence of the wide electrode 154 at the load position xn increases the bonding strength with the solder 218.

The following will describe Variation Examples of the semiconductor laser device 200A.

Variation Example 1

Figure 2:
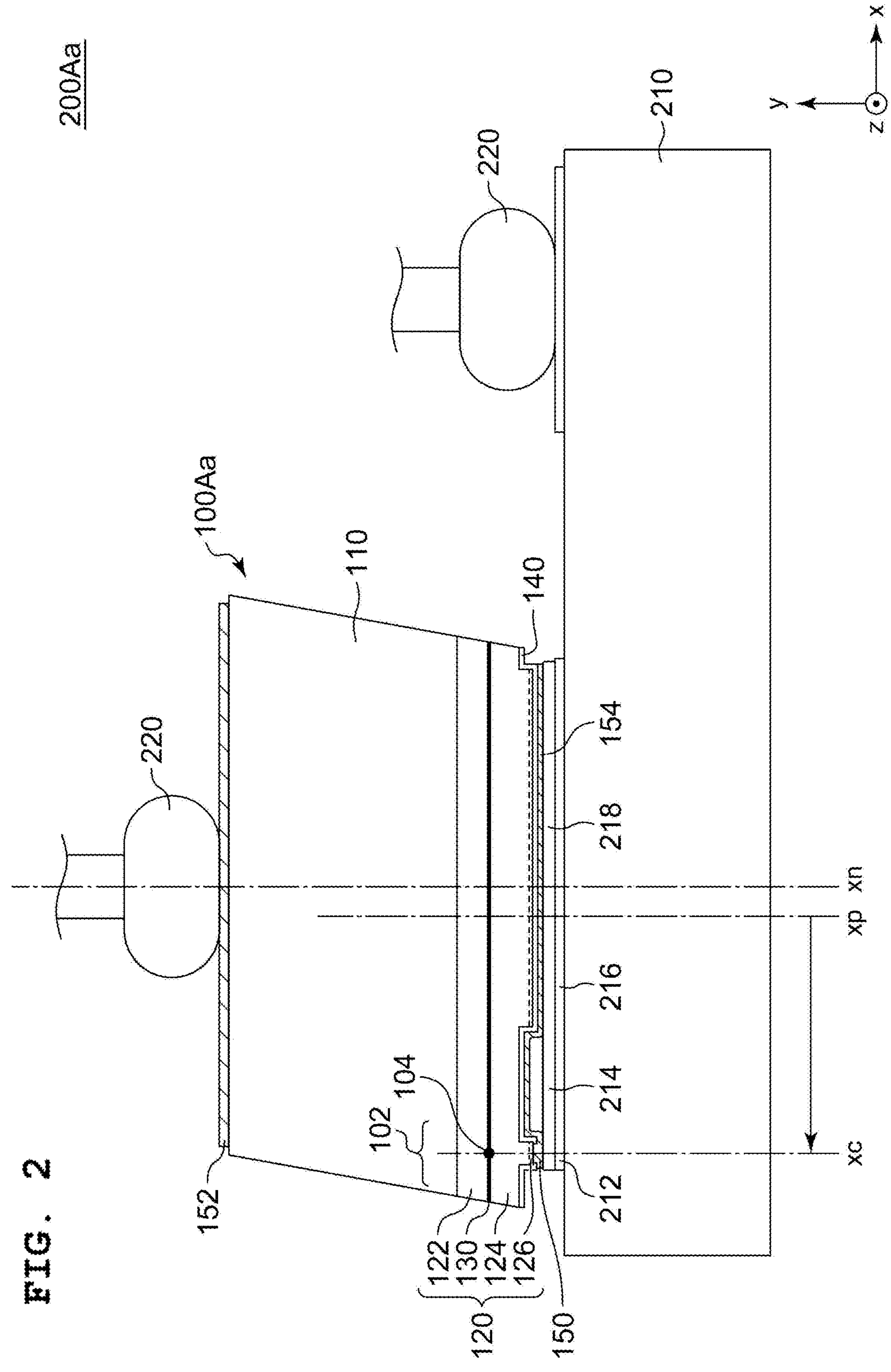
FIG. 2 is a cross-sectional view of a semiconductor laser device according to Variation Example 1.

FIG. 2 is a cross-sectional view of a semiconductor laser device 200Aa according to Variation Example 1. In the semiconductor laser device 200Aa, the P electrode 150 and the wide electrode 154 are formed to be electrically continuous. The wiring patterns 212 and 216 are also electrically continuous. Variation Example 2

Figure 3:
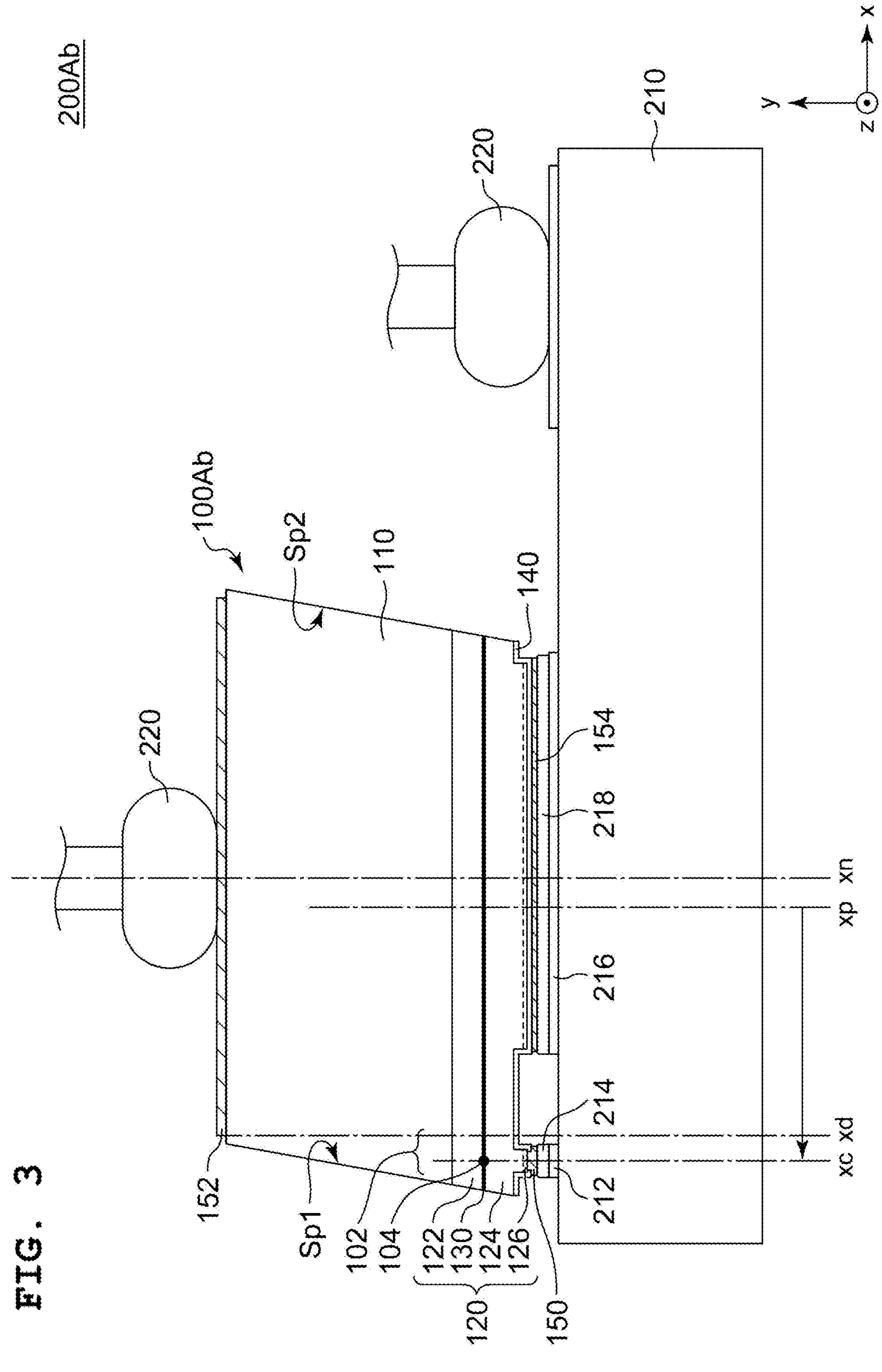
FIG. 3 is a cross-sectional view of a semiconductor laser device according to Variation Example 2.

FIG. 3 is a cross-sectional view of a semiconductor laser device 200Ab according to Variation Example 2. In this Variation Example, the position xc of the laser resonator 102 is shifted at a position to even closer to the first pelletized face Sp1 than that of the semiconductor laser device 200A shown in FIG. 1.

In FIG. 3, the position of the end of the N electrode 152 on the first pelletized face Sp1 is indicated as xd. In this Variation Example, the position xc of the laser resonator 102 is even closer to the first pelletized face Sp1 than the position xd.

Figure 4:
FIG. 4 is a diagram describing a position xc of the laser resonator.
Figure 4:
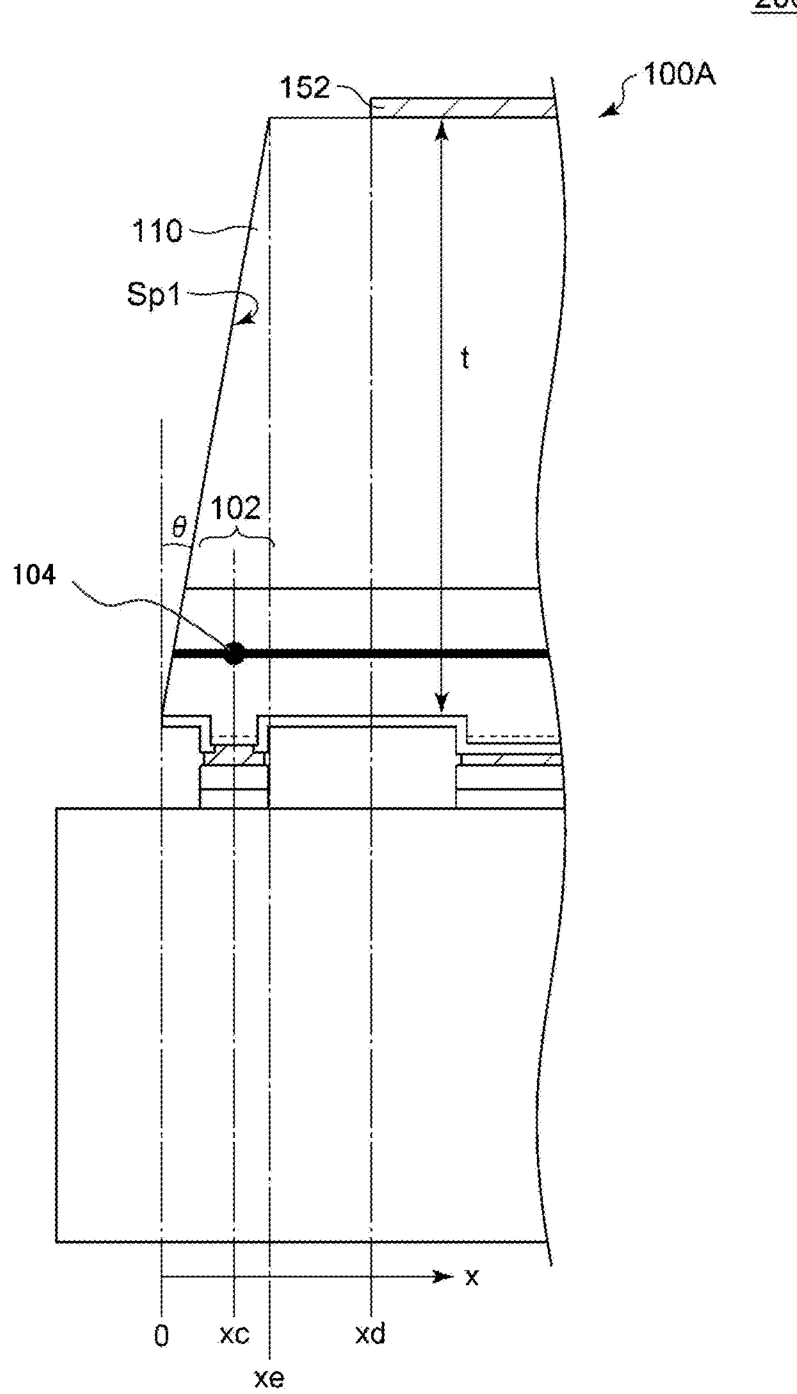

FIG. 4 is a diagram describing the position xc of the laser resonator 102. The end of the semiconductor laser chip 100A is taken as the origin of the x coordinate. The position of the end of the N electrode 152 is represented by xd, and the position of the end of the second face of the semiconductor substrate 110 is represented by xe. In other words, xc, xe, and xd each represent a distance from the end of the semiconductor laser chip 100A.

In this case, it is preferable to satisfy xc≤xd. For example, when the tilted angle θ of the semiconductor substrate 110 is 10° and the thickness t of the semiconductor substrate 110 and the stacked growth layer 120 combined is 100 μm, it is xe=100 μm×tan 10°≈18 μm. When the distance from a tip end xe to the end of the N electrode 152 is 20 μm, then it is xd=38 μm. Hence, the configuration is designed to satisfy xc≤38 μm.

To further reduce the effects of stress, it is preferable to satisfy xc≤xe. When t=100 μm and θ=10°, the configuration is designed to satisfy xc≤18 μm.

The position xc and the thickness t may satisfy the relationship xc≤t/3. When t=100 μm, xc≤33 μm.

The lower limit of the position xc is constrained by the beam diameter and the thickness of the P electrode 150. Specifically, xc being larger than 1 μm allows the stable performance and the yield rate of qualifying mass production to be expected. Furthermore, with manufacturing stability being considered, xc 4 μm is more suitable.

In summary, xc, which is a distance between the laser resonator 102 and the end of the semiconductor laser chip 100A in the above example, is preferably 38 μm or less, and more preferably 18 μm or less. In addition, the distance xc is preferably 1 μm or more, and more preferably 4 μm or more.

Variation Example 3

The semiconductor laser chip 100A is pelletized and cleaved from a single wafer to form individual pieces. As in Variation Example 2, making the position xc of the laser resonator 102 closer to the first pelletized face Sp1 may affect the optical or mechanical characteristics of the laser resonator 102 if the position of the pelletized line (pelletized face) is shifted in the x-axis direction. Hence, it is necessary to enhance the accuracy of the pelletized position.

Figure 5A:
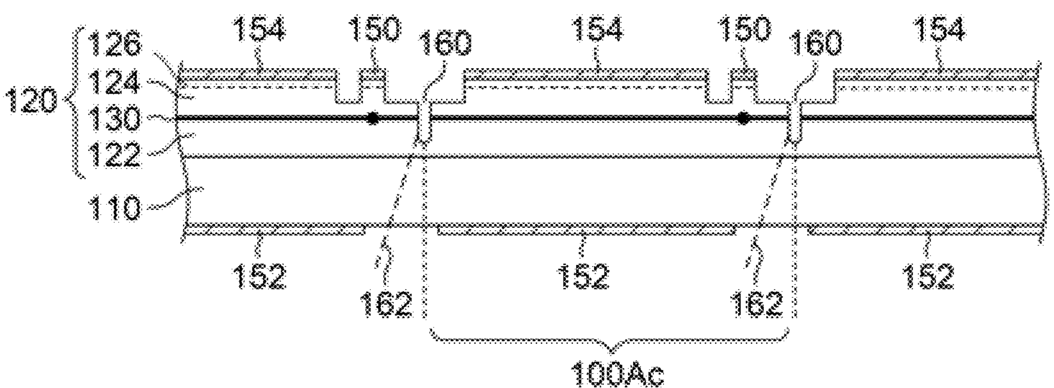
FIGS. 5A to 5C are cross-sectional views of the semiconductor laser chip according to Variation Example 3.
Figure 5B:
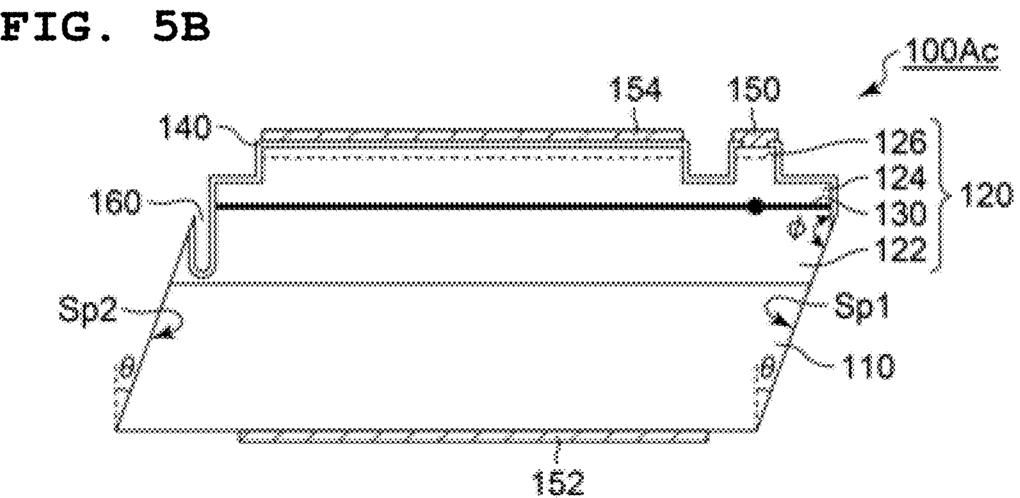
Figure 5C:
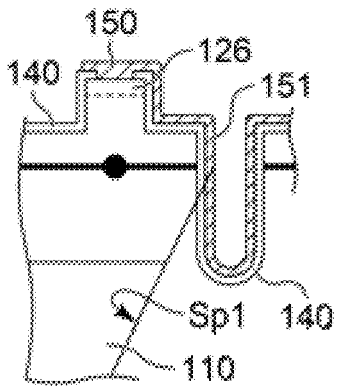

FIGS. 5A to 5C are cross-sectional views of a semiconductor laser chip 100Ac according to Variation Example 3. FIG. 5A illustrates the semiconductor laser chip 100Ac before being pelletized, and FIG. 5C illustrates the semiconductor laser chip 100Ac after being pelletized.

As shown in FIG. 5A, for the semiconductor laser chip 100Ac before being pelletized, pelletized grooves 160 are formed between the adjacent semiconductor laser chips 100Ac in the wafer process. For example, the pelletized grooves 160 are formed by etching after forming the P-type contact layer 126 on the semiconductor substrate 110. Then, insulation layers and electrodes are formed.

The pelletized groove 160 is perpendicular to the semiconductor substrate 110, and the depth of the pelletized groove 160 is deeper than the light-emitting layer 130 and reaches at least the N-type cladding layer 122. The depth of the pelletized groove 16 may reach the semiconductor substrate 110.

In the pelletizing process, the semiconductor laser chip 100Ac is cut out by breaking the wafer along pelletized lines 162 that pass through the pelletized groove 160. The pelletized line 162 is typically a line along the crystal orientation of the semiconductor substrate 110.

With reference to FIG. 5B, the first pelletized face Sp1 of the individualized semiconductor laser chip 100Ac is focused on. When pelletizing is performed after the pelletized grooves are formed, the side face of the stacked growth layer 120 is substantially perpendicular to the front surface of the semiconductor substrate 110 because the traces of the pelletized grooves 160 remain. In contrast, the pelletized face Sp1 of the semiconductor substrate 110 is oriented to an angle in accordance with the crystal orientation of the semiconductor substrate 110. As a result, the side face of the semiconductor laser chip 100 Ac is not flat and has an angle θ.

With reference to FIG. 5B, the second pelletized face Sp2 is focused on. Most of the traces of the pelletized groove 160 remain on the side of the stacked growth layer 120, resulting in a J-shaped cross-section. In contrast, the side face of the semiconductor substrate 110 (pelletized face Sp2) is oriented to the direction θ in accordance with the crystal orientation of the semiconductor substrate 110.

As shown in FIG. 5B, it is preferable that the insulation layer 140 is also formed on the surface of the pelletized groove 160. This can protect the PN junction portion at the side faces Sp1 and Sp2 of the semiconductor laser chip 100Ac, thereby preventing short circuit and the like caused by solder and foreign matter. If the protection of the PN junction on the side faces is to be achieved by a typical manufacturing method that does not form the pelletized grooves 160, it is necessary to form a protection layer with an additional process after pelletizing. In contrast, forming the insulation layer 140 on the surface of the pelletized groove 160 has the advantage of eliminating an additional process after pelletizing.

FIG. 5C illustrates a Variation Example of the pelletized groove 160. In this example, the insulation layer 140 is formed on the surface of the pelletized groove 160, and an electrode 151 is formed over it. This electrode 151 is preferably continuous with the P electrode 150.

The structure shown in FIG. 5C provides effects on the protection of the PN junction by the insulation layer 140. Furthermore, the added electrode 151 serves the function of enhancing heat dissipation effects. Since this electrode 151 is located close to the laser resonator 102, which is a heat source, a high heat dissipation effect can be expected. Making the electrode 151 be located continuously with the P electrode 150 is capable of further enhancing the heat dissipation effects.

Variation Example 4

Figure 6:
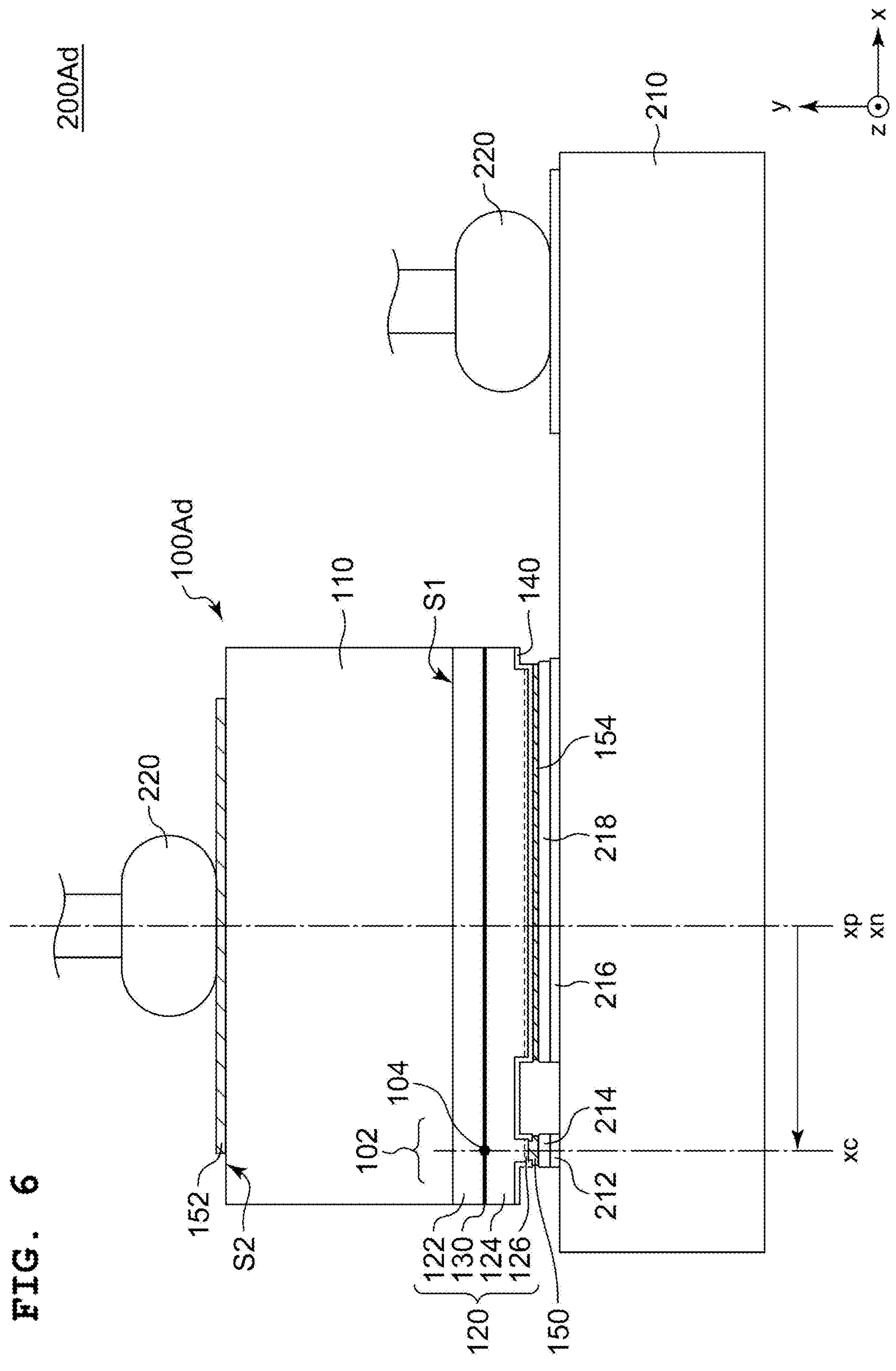
FIG. 6 is a cross-sectional view of a semiconductor laser device according to Variation Example 4.

FIG. 6 is a cross-sectional view of a semiconductor laser device 200Ad according to Variation Example 4. In this Variation Example, a substrate with a vertical pelletized face and a rectangular cross-section is used, instead of a tilted substrate, as the semiconductor substrate 110. In this Variation Example, it is notable that the load position xn coincides with the reference position xp, which is the center of the first face S1 of the semiconductor substrate 110. Even in this case, satisfied is the condition such that the laser resonator 102 is located at the position xc that is farther than the reference position xp when viewed from the load position xn.

Variation Example 5

Figure 7:
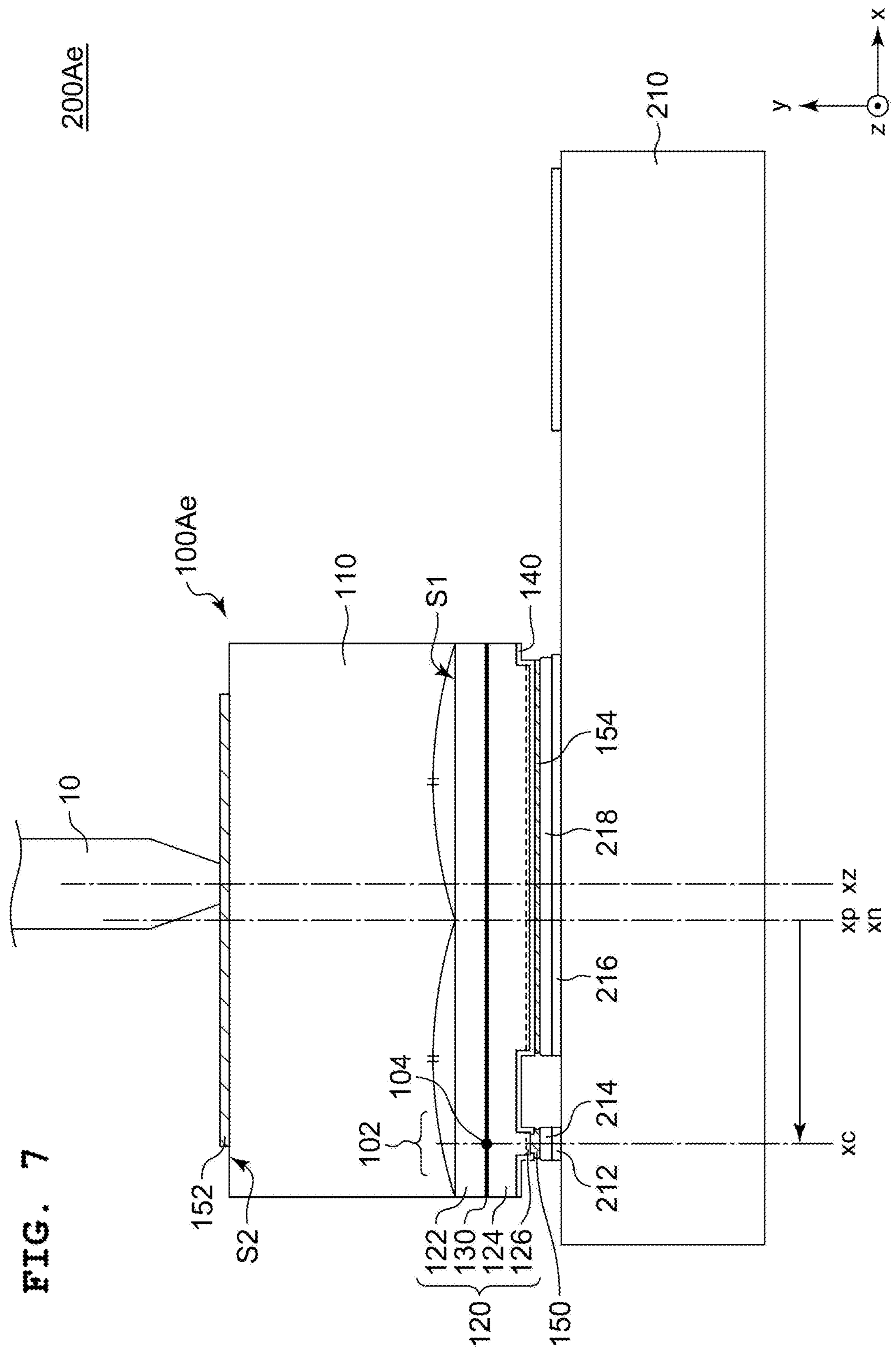
FIG. 7 is a cross-sectional view of a semiconductor laser device according to Variation Example 5.

FIG. 7 is a cross-sectional view of a semiconductor laser device 200Ae according to Variation Example 5. In this Variation Example, the semiconductor substrate 110 having a vertical pelletized face is used as is similar to that in FIG. 6. FIG. 7 illustrates die bonding. A semiconductor laser chip 100Ae is pressed against the submount 210 by a collet 10. In this Variation Example, the position xz of the collet 10 is off the center xn of the second face S2, and the position xz is the exact load position. In this case, the laser resonator 102 is located at a position closer to the pelletized face than the reference position xp, when viewed from the load position xz.

Variation Example 6

Figure 8:
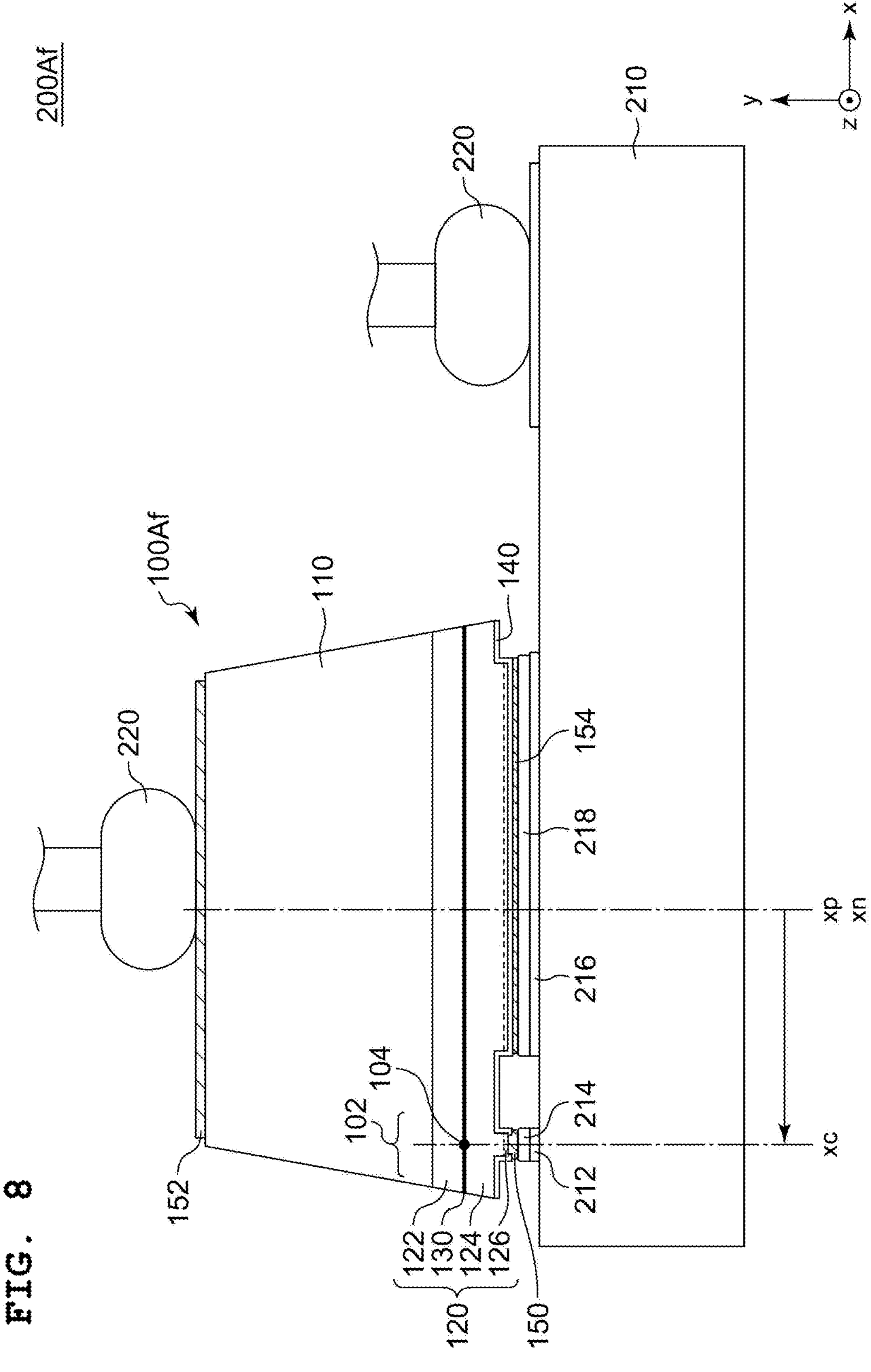
FIG. 8 is a cross-sectional view of a semiconductor laser device according to Variation Example 6.

FIG. 8 is a cross-sectional view of a semiconductor laser device 200Af according to Variation Example 6. In this Variation Example, a tilted substrate having a trapezoidal cross-section is used as the semiconductor substrate 110.

Variation Example 7

Figure 9:
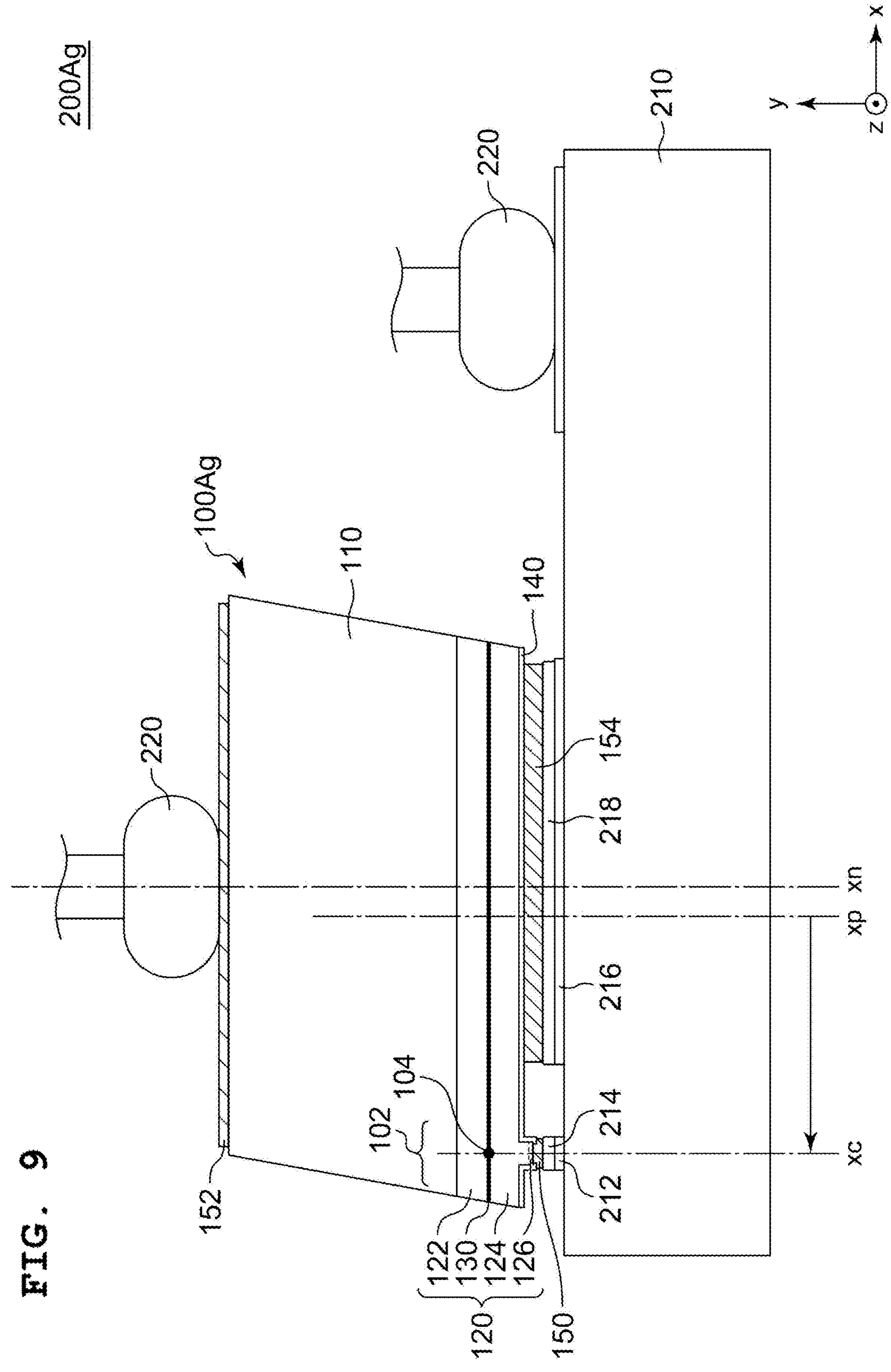
FIG. 9 is a cross-sectional view of a semiconductor laser device according to Variation Example 7.

FIG. 9 is a cross-sectional view of a semiconductor laser device 200Ag according to Variation Example 7. In this Variation Example, the ridge and the adjacent bank are omitted. The wide electrode 154 is formed over a wide area including the load position xn. The thickness of the wide electrode 154 in FIG. 9 is larger than the thickness of the wide electrode 154 in FIG. 1, etc.; in this Variation Example, it is configured to be substantially the same height as that of the laser resonator 102 upon the bonding to the submount 210.

Other Variation Example

The wide electrode 154 is formed adjacent to the P electrode 150 as a bonding electrode, but the width and structure of the bonding electrode are not particularly limited thereto; a plurality of electrodes each having a narrow width may be arranged in the x-axis direction, for example. In other words, the wide electrode 154 may be formed by dividing it into multiple pieces in the x-axis direction.

Example 2

Figure 10:
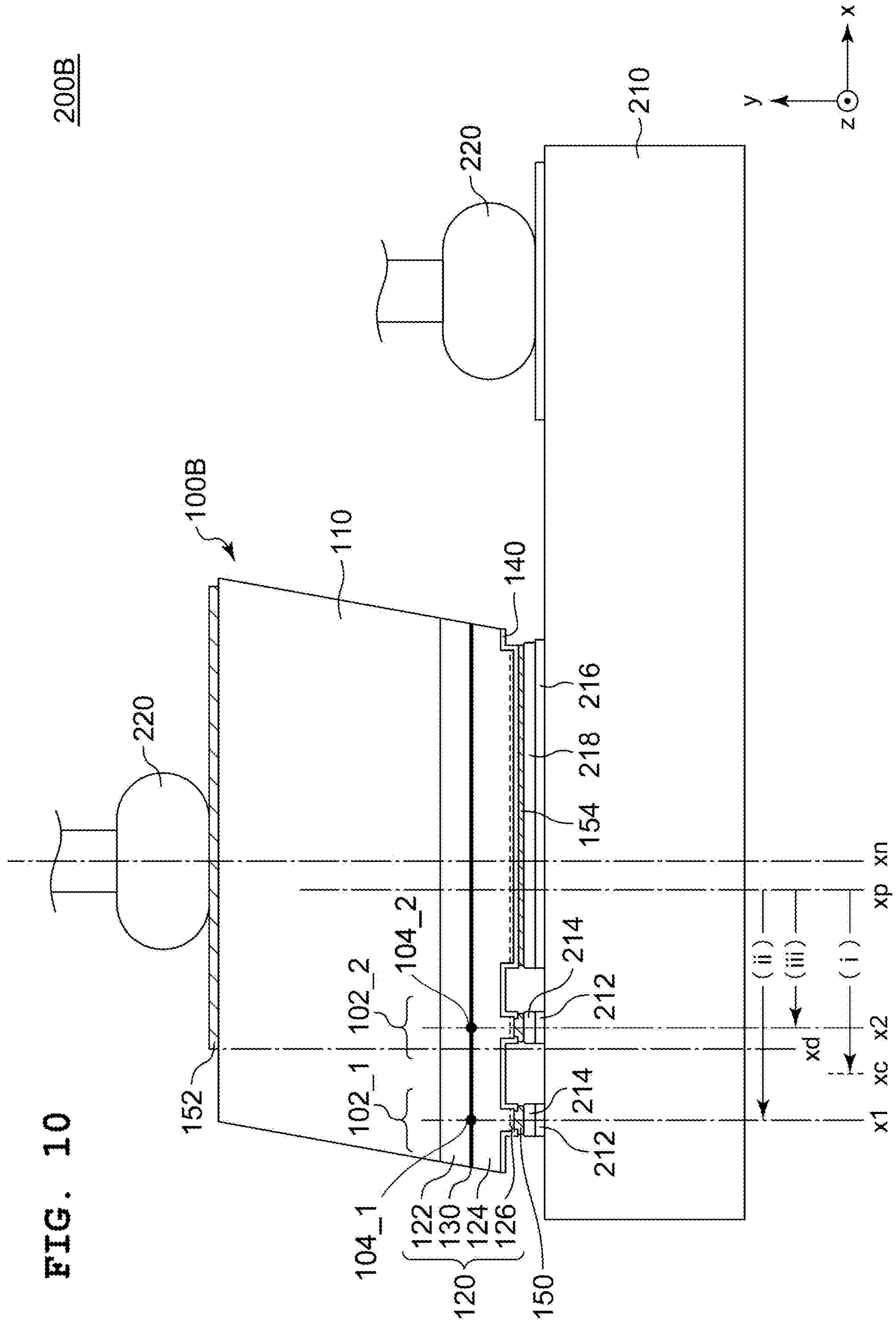
FIG. 10 is a cross-sectional view of a semiconductor laser device according to Example 2.

FIG. 10 is a cross-sectional view of a semiconductor laser device 200B according to Example 2. The semiconductor laser device 200B is of multi-beam laser and includes a plurality of m laser resonators (m≥2) 102_1 to **102_*m* that are formed separately in the x-axis direction. In FIG. 7**, m=2.

When m≥2, the position xc of the m laser resonators 102 is the center position between the emitter 104_1 of the laser resonator 102_1 at one end and the emitter **104_*m* of the laser resonator 102_*m* at the other end. In the case of m=2, when the positions of the laser resonators 102_1 and 102_2 are defined as x1 and x2, respectively, then xc=(x1+x2**)/2.

As is similar to Example 1, the center position xc of the two laser resonators 102_1 and 102_2 is located opposite to the load position xn with respect to the reference position xp. In other words, the center position xc of the two laser resonators 102_1 and 102_2 are shifted in a direction away from the load position xn ((i) in the figure)

Furthermore, it is understood that the positions x1 and x2 of the two laser resonators 102_1 and 102_2, respectively, are also shifted in the same direction away from the load position xn with respect to the reference position xp ((ii) and (iii) in the figure).

Variation Examples according to Example 2 will be described below.

Variation Example 8

Figure 11:
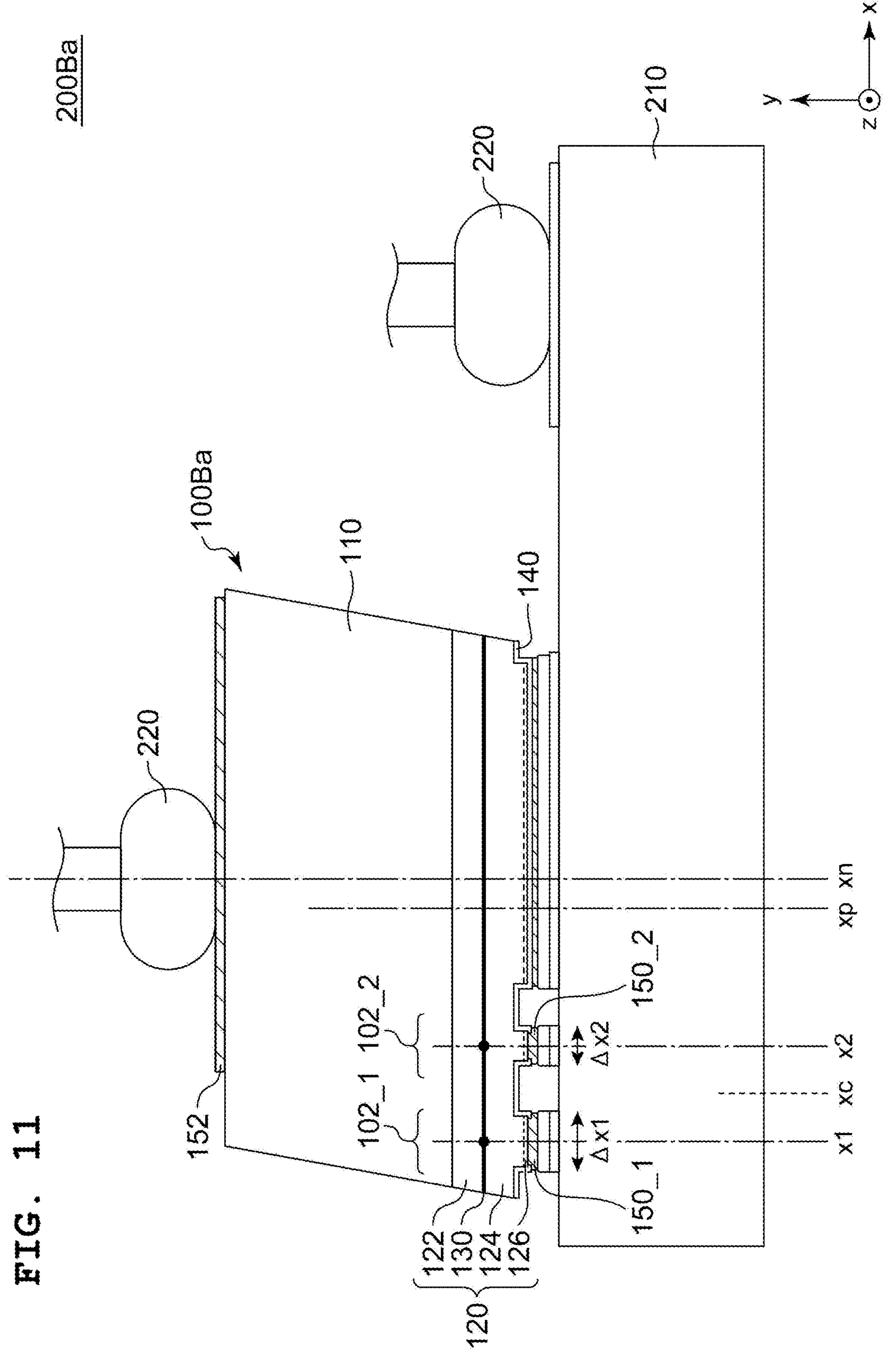
FIG. 11 is a cross-sectional view of a semiconductor laser device according to Variation Example 8.

FIG. 11 is a cross-sectional view of a semiconductor laser device 100Ba according to Variation Example 8. In this Variation Example, the widths Δx1 and Δx2 of the P electrodes 150_1 and 150_2 in the laser resonators 102_1 and 102_2, respectively are different from each other. The electrode widths Δx1 and Δx2 enable the adjustment of the heat dissipation characteristics of the laser resonators 102_1 and 102_2, thereby making the operating temperature of the laser resonators 102_1 and 102_2 uniform. In addition, the electrode widths Δx1 and Δx2 enable the adjustment of the residual stress of the laser resonators 102_1 and 102_2, thereby making the optical characteristics of the laser resonators 102_1 and 102_2 uniform.

Other Variation Example

FIG. 10 illustrates the case where m=2, but m may be 3 or more. The variation examples described related to Example 1 can be applied to Example 2.

Example 3

Figure 12:
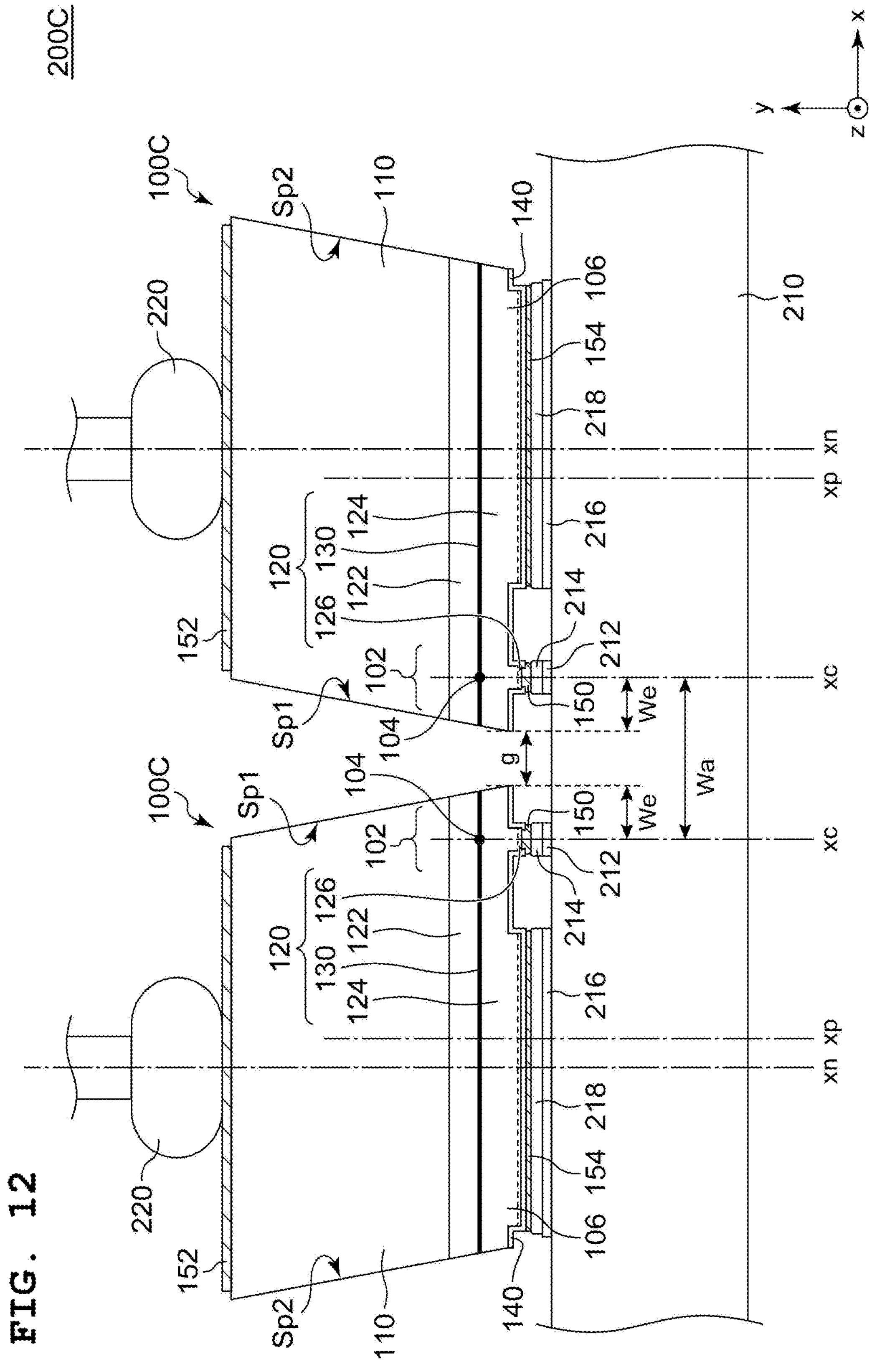
FIG. 12 is a cross-sectional view of a semiconductor laser device according to Example 3.

FIG. 12 is a cross-sectional view of a semiconductor laser device 200C according to Example 3. The semiconductor laser device 200C is a multi-beam laser and includes two semiconductor laser chips 100C and the submount 210. The two semiconductor laser chips 100C each have the same configuration as the semiconductor laser chip 100A of Example 1 and are symmetrical with respect to the x-axis direction.

As described in Example 1, in response to forming the laser resonator 102 close to the first pelletized face Sp1, a distance Wa between the two emitters 104 is designed according to the application of the semiconductor laser device 200C, and is less than 100 μm, for example. When a gap g between the two semiconductor laser chips 100C is close to near zero, a distance We between the position xc of the laser resonator 102 and the end of the semiconductor laser chip 100C is Wa/2=50 μm or less.

More specifically, as an example, the distance Wa between the two emitters 104 can be Wa≤50 μm. In this case, the distance We can be We≤25 μm. When Wa≤30 μm, then We≤15 μm.

In Example 3, the semiconductor substrate 110 of the semiconductor laser chip 100C is not limited to the tilted substrate, but may be the semiconductor substrate 110 in FIG. 6 or FIG. 8.

In Example 3, the semiconductor laser chip 100C may have two or more laser resonators 102. In this case, the semiconductor laser chip 100B of FIG. 10 may be configured to be disposed in line symmetry with respect to the x-axis direction.

Example 4

Figure 13:
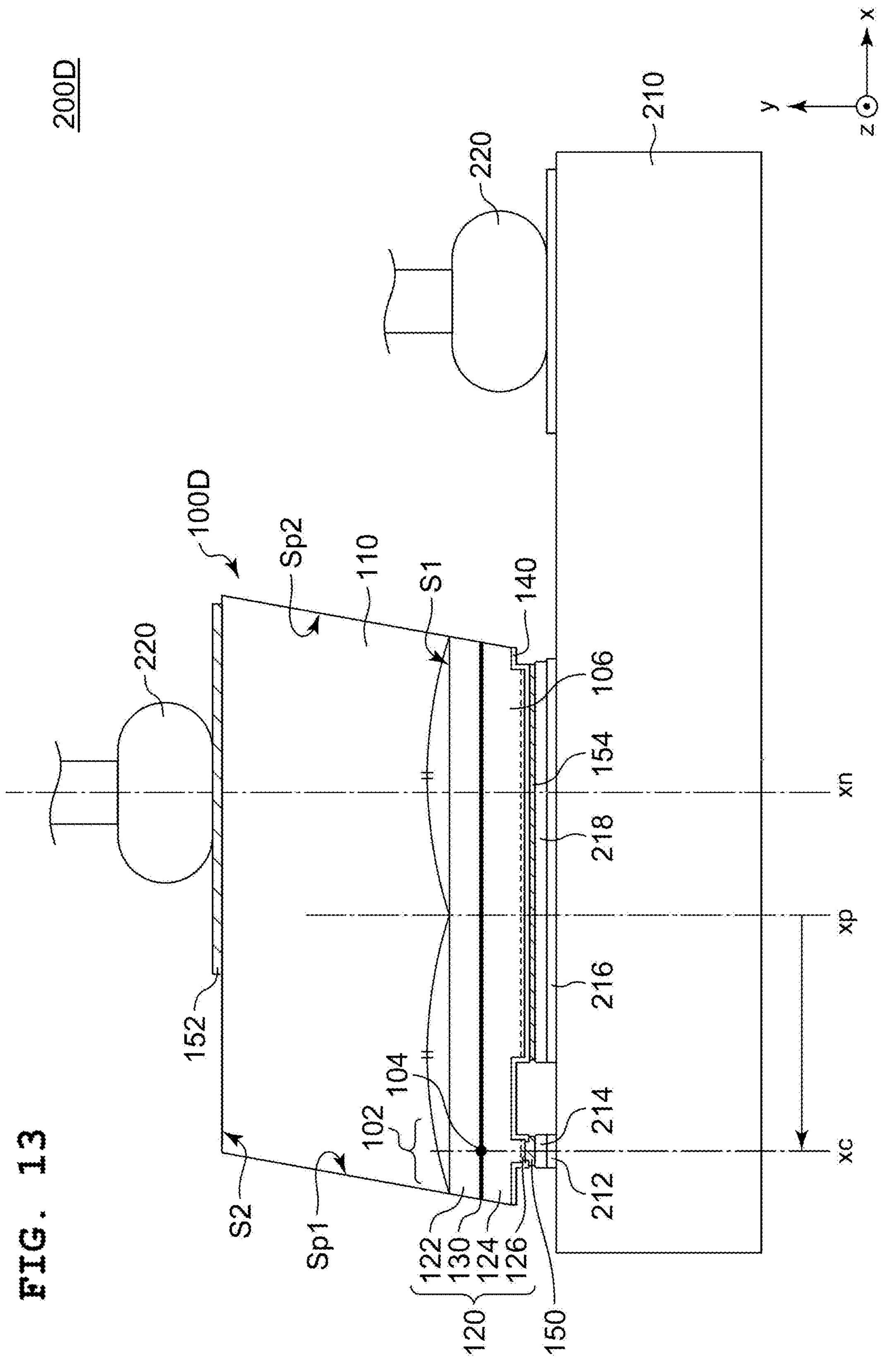
FIG. 13 is a cross-sectional view of a semiconductor laser device according to Example 4.

FIG. 13 is a cross-sectional view of a semiconductor laser device 200D according to Example 4. In the above description, it is assumed that the load position during die bonding exists near the center of the second face S2 of the semiconductor laser chip 100. In Example 4, the N electrode 152 is disposed to be shifted to the right side (or left side) in the second face S2 of the semiconductor laser chip 100D. In this case, the suction position of the collet is near the center of the N electrode 152, then the load position xn is shifted from the center of the second face S2.

In Example 4, the center of the N electrode 152 is considered to be the load position xn. The laser resonator 102 is located in the side opposite to the load position xn, which is the center of the N electrode 152 with respect to the reference position xp. In other words, the laser resonator 102 is disposed at the position xc away from the load position xn with respect to the reference position xp as a starting point. This reduces the load applied to the laser resonator 102 during die bonding, thereby suppressing mechanical and optical effects on it.

Example 5

In Examples 1 to 3, it is assumed that the load position xn exists near the center of the second face S2 of the semiconductor laser chip 100. In Example 4, it is assumed that the load position xn exists near the center of the N electrode 152. In Example 5, the position of the laser resonator 102 is determined on the assumption that the load position xn exists in the vicinity of the center position of the bonding wire 220. This can be explained using FIG. 13, which is similar to Example 4. That is, the laser resonator 102 is located on the side closer to the pelletized face Sp1, opposite to the load position xn, which is the center of the bonding wire 220, with respect to the reference position xp. In other words, the laser resonator 102 is disposed at the position xc away from the load position xn with respect to the reference position xp as a starting point. This reduces the load applied to the laser resonator 102 during die bonding, thereby suppressing mechanical and optical effects on it.

The embodiments merely show the principle and application of the present disclosure or invention, and many variation examples and modifications in the arrangement are allowed for the embodiments to the extent that does not depart from the idea of the present disclosure or invention as stipulated in the scope of the claims.

What is claimed is:

1. A semiconductor laser device comprising:

a submount; and an edge-emitting semiconductor laser chip mounted to the submount by a junction-down method, the semiconductor laser chip including:

a semiconductor substrate having a first pair of a first face and a second face opposing the first face and a second pair of a first side face and a second side face opposing the first side face;

a stacked growth layer in which m (m≥1) laser resonators are formed;

m P electrodes connected to the m laser resonators; and an N electrode formed on a-the second face of the semiconductor substrate and having edges over a predetermined length which is shorter than the second face, wherein the stacked growth layer includes a first conductive cladding layer, a light-emitting layer having an emitter, and a second conductive cladding layer, and is formed on the first face of the semiconductor substrate, and when a beam emission direction of the emitter is denoted as a z-axis, a direction of the thickness of the semiconductor substrate as a y-axis, and a direction orthogonal to the z-axis and the y-axis as an x-axis, the m laser resonators are located in an area of the stacked growth layer except directly under a center of the second face of the semiconductor substrate in the x-axis direction, wherein the emitter closest to the first side face along the x-axis is located between a first virtual vertical line along the y-axis through a corresponding one of the edges of the N electrode and a second virtual line extending from an edge of the first side face of the semiconductor substrate.

2. The semiconductor laser device according to claim 1, wherein the semiconductor substrate is a tilted substrate having a first pelletized face having an acute angle with the first face and a second pelletized face having an obtuse angle with the first face, and the m laser resonators is located on a side of the first pelletized face in the x-axis direction with respect to a center of the first face.

3. The semiconductor laser device according to claim 2, wherein, of the m laser resonators, the laser resonator closest to the first pelletized face is located closer to the first pelletized face than one of the edges of the N electrode on the side of the first pelletized face.

4. The semiconductor laser device according to claim 1, wherein a side face of the semiconductor laser chip is substantially perpendicular to the submount in a first portion near the submount and tilted in a second portion far from the submount.

5. The semiconductor laser device according to claim 4, wherein the side face of the semiconductor laser chip is covered with an insulation layer in the first portion.

6. The semiconductor laser device according to claim 5, wherein the insulation layer on the side face of the semiconductor laser chip is covered with a metal layer.

7. The semiconductor laser device according to claim 1, wherein the semiconductor laser chip further includes a wide electrode adjacent to the m P electrodes and formed in an area including the center of the second face.

8. The semiconductor laser device according to claim 1, wherein it is m≥2 and each laser resonator has a different width of the P electrode.

9. The semiconductor laser device according to claim 1, wherein the semiconductor substrate is a rectangular substrate with a vertical pelletized face and a rectangular cross-section.

10. The semiconductor laser device according to claim 1, wherein the emitter closest to the first side face along the x-axis is located between a first virtual vertical line along the y-axis through a corresponding edge of the semiconductor substrate and a second virtual line extending from the edge of the first face of the semiconductor substrate.

11. A semiconductor laser device comprising: a submount; and an edge-emitting semiconductor laser chip mounted to the submount by a junction-down method, the semiconductor laser chip including:

a semiconductor substrate having a first pair of a first face and a second face opposing the first face and a second pair of a first side face and a second side face opposing the first side face;

a stacked growth layer in which m (m≥1) laser resonators are formed;

m P electrodes connected to the m laser resonators; and an N electrode formed on the second face of the semiconductor substrate and having edges over a predetermined length which is shorter than the second face, wherein the stacked growth layer includes a first conductive cladding layer, a light-emitting layer having an emitter, and a second conductive cladding layer, and is formed on the first face of the semiconductor substrate, and when a beam emission direction of the emitter is denoted as a z-axis, a direction of the thickness of the semiconductor substrate as a y-axis, and a direction orthogonal to the z-axis and the y-axis as an x-axis, the m laser resonators are located in an area of the stacked growth layer except directly under a center of the second face of the semiconductor substrate in the X-axis direction, wherein the emitter closest to the first side face along the x-axis is located on or at a point beyond a first virtual vertical line along the y-axis through a corresponding one of the edges of the N electrode towards the first side face of the semiconductor substrate.

* * * * *